United States Patent [19]
Tsui

[11] Patent Number: 5,702,566
[45] Date of Patent: Dec. 30, 1997

[54] CONDUCTIVE PHOTORESIST TO MITIGATE ANTENNA EFFECT

[75] Inventor: Bing-Yue Tsui, Hsinchu, Taiwan

[73] Assignee: Industrial Technology Research Institute, Hsinchu, Taiwan

[21] Appl. No.: 629,117

[22] Filed: Apr. 8, 1996

[51] Int. Cl.⁶ .................................................. H01L 21/00
[52] U.S. Cl. .................... 156/643.1; 156/659.11; 216/41; 216/67; 437/189; 437/229
[58] Field of Search ............... 156/643.1, 644.1, 156/659.11, 656.1; 216/41, 67; 437/189, 192, 197, 198, 199, 229, 245, 246

[56] References Cited

U.S. PATENT DOCUMENTS

| | | | |
|---|---|---|---|
| 5,350,710 | 9/1994 | Hong et al. | 437/170 |
| 5,393,701 | 2/1995 | Ko et al. | 437/193 |

OTHER PUBLICATIONS

"Gate Oxide Charging and Its Elimination for Metal Antenna Capacitor and Transistor in VLSI CMOS Double Layer Metal Technology" pub in Symposium on VLSI Technology, Jun. 1988 pp. 73–74.

*Primary Examiner*—William Powell
*Attorney, Agent, or Firm*—George O. Saile; Stephen B. Ackerman

[57] ABSTRACT

During gas plasma etching, trapped charge from the plasma can be concentrated in semiconductor devices through the conductive portions of an integrated circuit, leading to their damage. This is known as the antenna effect. This effect can be mitigated by using a photoresist that is electrically conductive during plasma etching. This has been shown to reduce said charge accumulation and device damage. Said conductive photoresist is employed during integrated circuit processing in the same way as is the standard photoresist of the prior art.

18 Claims, 2 Drawing Sheets

CONDUCTIVE PHOTORESIST TO MITIGATE ANTENNA EFFECT

BACKGROUND OF THE INVENTION (1) Field of the Invention

The invention relates to the general field of plasma etching with particular reference to the antenna effect.

(2) Descriptin of the Prior Art

Dry etching, wherein the etchant is an electrically excited gas, is widely used in the integrated circuit art. In general, the surface to be etched is coated with a patterned layer of photoresist and then exposed to a gaseous plasma of a corrosive gas.

A typical example is illustrated in FIG. 1. A field effect device, comprising source region 1 and drain region 2 (which are embedded in semiconductor substrate 3) has a gate 4 (embedded in insulating layer 5) separated from the surface of semiconductor 3 by thin insulating layer 6. Via hole 7 has been formed in layer 5 so that conductive layer 8, deposited on insulating layer 5, can make contact with gate 4. Additionally, layer 8 needs to be patterned to form interconnections between gate 4 and other parts of the integrated circuit, possibly including one or more large area pads. To this end, photoresist layer 9 has been deposited over layer 8 and then exposed through a mask to protect those parts of layer 8 that are not to be removed.

In certain situations dry etching in a gaseous plasma offers several advantages over wet etching but plasma etching is also subject to a problem known as the antenna effect. Since the plasma comprises a mix of charged particles there is sometimes a tendency for some of said particles to accumulate on certain surfaces. In a situation such as illustrated in FIG. 1 layer 8 could become charged. While said charge may attach itself to layer 8 at any point on its surface, since layer 8 is a conductor the full effect of the accumulated charge is transmitted down via hole 7 to gate 4, bringing about changes in the threshold voltage of the FET device and even breakdown of thin insulating layer 6. It is this widespread collection of charge followed by its concentration in a small area that has given rise to the term 'antenna effect'.

The antenna effect has been discussed in some detail in a paper by F. Shone et al. entitled "Gate oxide charging and its elimination for metal antenna capacitor and transistor in VLSI CMOS double layer metal technology" published in the Symposium on VLSI Technology June 1988, pp. 73–74. They describe three approaches to mitigating the antenna effect: (i) increasing the time of the alloy cycle thereby giving surface states more time to anneal out (ii) covering the metal antenna with a layer of insulation to keep it from direct contact with the plasma and (iii) attaching a temporary substrate diode to the antenna for the purpose of bleeding off antenna charge as it builds up.

Other approaches to dealing with the antenna effect have involved temporary electrical isolation of susceptible devices during plasma etching. Ko et al. (U.S. Pat. No. 5,393,701 Feb. 1995) break the connection between the devices and the antenna and then re-form it at the conclusion of plasma etching. Hong et al. (U.S. Pat. No. 5,350,710 Sep. 1994) insert an antifuse device between the devices and the antenna. Said device is initially in its high impedance state and, after plasma etching, gets permanently changed to its low impedance state.

It will be noted that all the above approaches to dealing with the antenna effect involve either additional process steps or some modification of the process.

SUMMARY OF THE INVENTION

It has therefore been an object of the present invention to provide a means for mitigating the antenna effect during plasma etching without affecting or altering the processes already in current use for plasma etching.

A further object of the present invention has been to provide a means for mitigating the antenna effect during plasma etching without materially adding to the cost of the processes already in current use for plasma etching.

These objects have been achieved by providing a photoresist that is electrically conductive. This has been shown to reduce the charge accumulation and device damage that occurs during plasma etching as a consequence of the antenna effect. Said conductive photoresist is employed during integrated circuit processing in the same way as is the standard photoresist of the prior art.

DESCRIPTION OF THE PREFERRED EMBODIMENTS

As discussed above, the antenna effect is associated with plasma etching. As part of our own investigation into the origins of this effect, semiconductor wafers that included a patterned layer of photoresist were subjected to plasma etching. This is shown schematically in FIG. 2. Wafers such as 13 (including a layer of silicon oxide not explicitly shown in the figure) were coated with conductive layer 18 which was, in turn, coated with patterned layer 19 of a standard photoresist. Following plasma etching it was confirmed that some charge had been trapped in the oxide layer as a result of the antenna effect. Said trapped charge was then removed (neutralized) by annealing the wafers in forming gas. The wafers were then reloaded into the etching chamber and exposed once more to the plasma, following which a check was made for trapped charge. None was seen.

Figure 1:
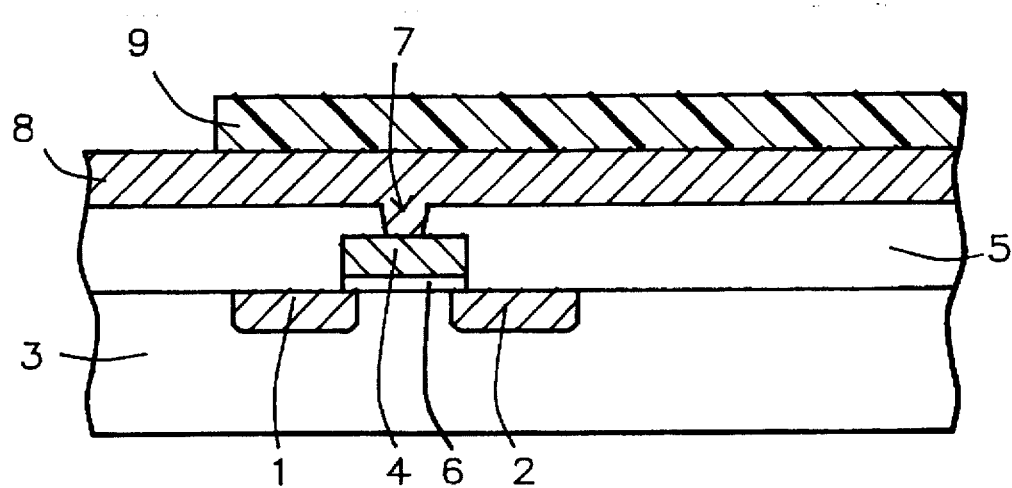
FIG. 1 is a schematic cross-section of an integrated circuit, including a layer of photoresist, which will be etched in a gaseous plasma.
Figure 2:
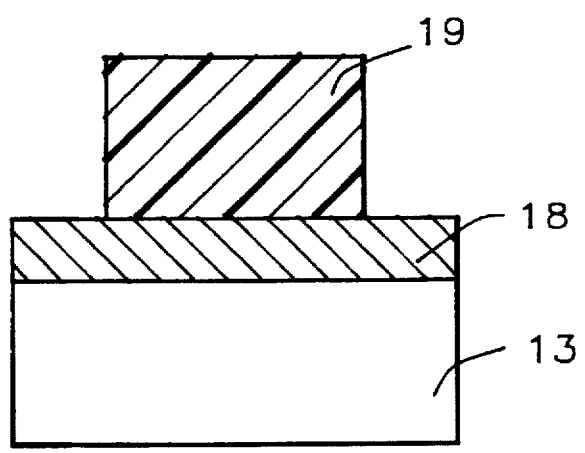
FIGS. 2 and 3 illustrate some conclusions reached as to the nature of the antenna effect.
Figure 3:
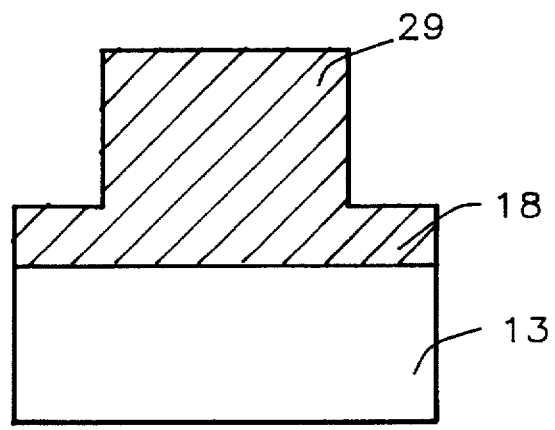

Another experiment was performed to confirm the significance of using a conductive photoresist during plasma etching. Conventional photoresist was used as a mask (as illustrated in FIG. 2, for example). After a partial etch of the metal the photoresist was removed, creating a metal step (as illustrated in FIG. 3). The wafer was then further etched in the plasma system. Etching was stopped when the metal in thin region 18 had been totally removed while still leaving some of thick region 29 in place. No antenna damage was observed for wafers etched in this manner. These experiments indicate that the antenna damage occurs near the end-point of etching in the presence of photoresist. Although the above described process is not suitable for production, it strongly suggests that, if an electrically conductive photoresist were used, the masked region would be treated in the same manner as thick metal region 29 in FIG. 3. This would reduce antenna damage to an acceptable level.

The present invention thus teaches the utilization of an electrically conductive photoresist in place of photoresists of the prior art, which are insulating. Said electrically conductive photoresist comprises an electrically conductive resin, a solvent, and a sensitizer.

An example of an electrically conductive resin is 3-hexylthiophene-3-thiophene-ethane-methacrylate copolymer. It will be understood that other, similar materials could also be used. As an example of a solvent that could be used we cite an acetonitrile solution of gold chloride, though it will be understood that other, similar solvents could also be used. Examples of sensitizers that could be used include gold chloride, although it will be understood that other, similar sensitizers (including no externally added sensitizer) could also be used.

Depending on the choices made in formulating the electrically conductive photoresist, it could be either a negative or a positive photoresist. That is, either the portion that was exposed to radiation or the portion that was not exposed could be left behind after development. The 'electrically conductive' material has a resistivity that is less than about $10^6$ ohm cm.

Figure 4:
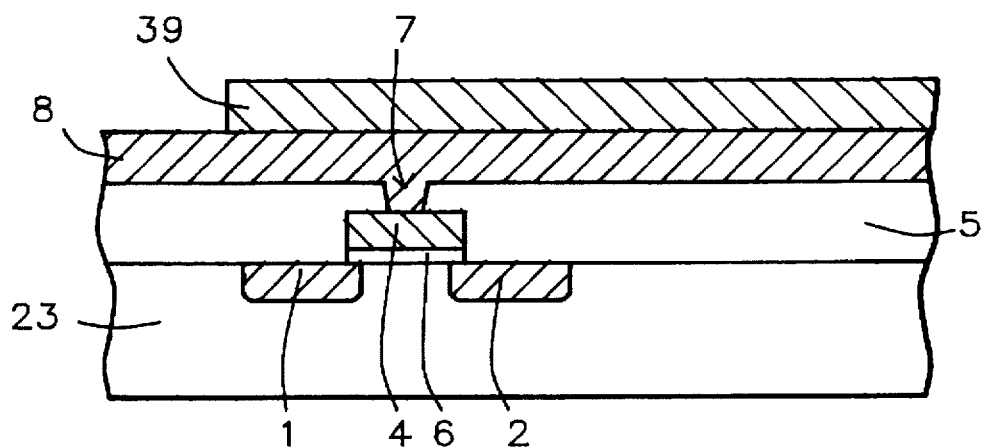
FIG. 4 is similar to FIG. 1 except that the photoresist in this case is electrically conductive.

We now describe a method for applying the present invention to the formation of multilevel interconnections in an integrated circuit. In FIG. 4 a portion of an integrated circuit is shown, including semiconductor substrate 23. The integrated circuit includes previously formed active and passive devices. Examples of the latter are not explicitly shown, but could include resistors and capacitors. An example of an active device is a field effect device, comprising, for example, source region 1, drain region 2, and gate 4. The latter is shown as embedded in insulating layer 5 but does not have to be.

Underlying layer 5 there is a patterned conductive layer. In some structures said layer could be metallic while in others it could be semiconducting. Frequently it comprises polysilicon (particularly in cases where substrate 23 comprises silicon). It is not shown explicitly in the figure, but comprises part of the upper surface of semiconductor substrate 23.

Following the provision of substrate 23 and associated devices, insulating layer 5, which may be composed of silicon oxide formed by low pressure deposited tetraethyl orthosilicate (TEOS) or boro-phosphosilicate glass (BPSG) was deposited to a thickness between about 0.2 and 1 microns. Via holes, such as 7, were then formed in layer 5. This was followed by the deposition of conductive layer 8 of aluminum-silicon-copper or titanium-titanium nitride, which both covered insulating layer 5 as well as making contact to gate 4 through via hole 7.

Next, electrically conductive photoresist layer 39 was applied to the surface of layer 8, by spin coating or similar means, to a thickness between about 1 and 2 microns. Layer 39 was then exposed to actinic radiation through a suitable optical system, including a mask, so that, after development, it had been patterned so as to protect layer 8 wheresoever desired.

The entire structure was now exposed to a plasma environment which included nitrogen, chlorine, and boron trichloride gases at a pressure between about 30 and 200 millitorr excited by the application of between about 350 and 750 watts at a frequency of 13.5 MHz. This led to the removal of material from layer 8 that had not been protected by conductive photoresist layer 39.

Finally, layer 39, having served its purpose, had also to be removed. This was accomplished by once more exposing the structure to a plasma environment of argon and oxygen at a pressure between about 30 and 200 millitorr excited by the application of between about 350 and 750 watts at a frequency of 13.5 MHz. This process converted patterned layer 39 to volatile (and hence easily removed) byproducts.

While the invention has been particularly shown and described with reference to the preferred embodiments thereof, it will be understood by those skilled in the art that various changes in form and details may be made without departing from the spirit and scope of the invention.

What is claimed is:

1. A method for mitigating the antenna effect during plasma etching of an integrated circuit comprising:

using an electrically conductive photoresist to protect portions of said integrated circuit that are not to be removed during said plasma etching.

2. The method of claim 1 wherein said electrically conductive photoresist further comprises:

an electrically conductive resin;

a solvent; and optionally, a sensitizer.

3. The method of claim 2 wherein said electrically conductive resin comprises 3-hexyl-thiophene-3-thiophene-ethanemethacrylate copolymer.

4. The method of claim 2 wherein said solvent comprises an aceto-nitrile solution of gold chloride.

5. The method of claim 2 wherein said sensitizer comprises gold chloride.

6. The method of claim 1 wherein said electrically conductive photoresist has a resistivity that is less than about $10^6$ ohm cm.

7. The method of claim 1 wherein said electrically conductive photoresist is a negative resist.

8. The method of claim 1 wherein said electrically conductive photoresist is a positive resist.

9. A method for forming multilevel interconnections in an integrated circuit comprising:

providing a semiconductor substrate;

forming active and passive devices on and in said substrate;

forming a patterned layer of a first conductive material to act as a first conductive contact to said devices;

depositing an insulating layer over said first layer of conductive material;

forming via holes in said insulating layer;

depositing a second conductive layer over said insulating layer and through said via holes;

applying and then patterning a layer of electrically conductive photo-resist over said second conductive layer;

exposing the integrated circuit to a first gaseous plasma environment thereby removing, from said second conductive layer, material not covered by said layer of electrically conductive photoresist; and then removing said layer of electrically conductive photoresist by exposing it to a second gaseous plasma environment.

10. The method of claim 9 wherein said semiconductor is silicon.

11. The method of claim 9 wherein said first conductive layer comprises polysilicon.

12. The method of claim 9 wherein said insulating layer is silicon oxide or borophosphosilicate glass.

13. The method of claim 9 wherein said insulating layer is deposited to a thickness between about 0.2 and 1 microns.

14. The method of claim 9 wherein said second conductive layer is titanium-titanium nitride or aluminum-silicon-copper.

15. The method of claim 9 wherein said layer of electrically conductive photoresist is applied by means of spin coating or sputtering.

16. The method of claim 9 wherein said layer of electrically conductive photoresist has a thickness between about 0.5 and 3 microns.

17. The method of claim 9 wherein said first gaseous plasma includes boron trichloride, chlorine, and nitrogen at a pressure between about 30 and 200 millitorr excited by the application of between about 350 and 750 watts at a frequency of 13.5 MHz.

18. The method of claim 9 wherein said second gaseous plasma includes oxygen and argon at a pressure between about 30 and 200 millitorr excited by the application of between about 350 and 700watts at a frequency of 13.5 MHz.

* * * * *